United States Patent [19]

Herman

[11] 4,036,578
[45] July 19, 1977

[54] PHOTOFLASH ARRAY AND METHOD OF CONSTRUCTION

[75] Inventor: Richard M. Herman, Cleveland, Ohio

[73] Assignee: General Electric Company, Schenectady, N.Y.

[21] Appl. No.: 686,145

[22] Filed: May 13, 1976

[51] Int. Cl.² .............................................. F27D 1/08
[52] U.S. Cl. ....................................... 431/98; 240/1.3; 431/95 R; 431/95 A
[58] Field of Search ........................ 431/95, 95 A, 98; 240/1.3; 317/101 CM

[56] References Cited

U.S. PATENT DOCUMENTS

| 2,752,580 | 6/1956 | Shewmaker | 317/101 CC |
| 2,937,358 | 5/1960 | Bulger | 317/101 CM |
| 3,912,442 | 10/1975 | Cote | 431/95 R |
| 3,935,442 | 6/1976 | Hanson | 240/1.3 |
| 3,941,992 | 3/1976 | Blount et al. | 431/95 A |
| 3,951,582 | 4/1976 | Holub et al. | 431/95 R |
| 3,956,625 | 5/1976 | Anderson | 431/95 A |
| 3,980,877 | 9/1976 | Cote | 240/1.3 |

*Primary Examiner*—William F. O'Dea
*Assistant Examiner*—R. J. Charvat
*Attorney, Agent, or Firm*—Norman C. Fulmer; Lawrence R. Kempton; Frank L. Neuhauser

[57] ABSTRACT

Eyelets are positioned through openings from one side of a circuit board so as to make electrical connections with circuit runs on the board, flash lamp lead-in wires are positioned through the eyelets, and shank portions of the eyelets extending from the other side of the board are bent over to hold the wires and secure the eyelets to the board. One or more of the eyelet shanks are bent so as to extend farther from the board than other eyelet shanks to make contact with a shield member and/or prevent the other eyelet shanks from contacting the shield member.

10 Claims, 8 Drawing Figures

U.S. Patent July 19, 1977 4,036,578

# PHOTOFLASH ARRAY AND METHOD OF CONSTRUCTION

CROSS-REFERENCE TO RELATED APPLICATIONS

Ser. No. 638,364, filed Dec. 8, 1975, Richard Blount, "Photoflash Lamp Array Having Shielded Switching Circuit," assigned the same as this invention.

Ser. No. 675,617, filed Apr. 9, 1976, Conrad E. Bechard, John M. Davenport, William H. Herrmann, and Steven N. Lovrekovic "Method of Making Electrical Connections," assigned the same as this invention.

Ser. No. 675,106, filed Apr. 9, 1976, Roger F. Jehlicka, "Method of Making Electrical Connections," assigned the same as this invention.

BACKGROUND OF THE INVENTION

The invention is in the field of photoflash arrays having a circuit board and a sheet-like shield member connected electrically to the circuit board.

The above-referenced Blount patent application discloses a "FlipFlash" type of photoflash array in which flash lamps are positioned over the front side of a circuit board and their lead-in wires extend into metal eyelets which are positioned through openings in the circuit board. The shanks of the eyelets extend from the back side of the board and are crimped or soldered to the lead-in wires. A sheet-like metal shield is positioned behind and parallel to the circuit board, and one or more eyelets are positioned through the circuit board at electrical ground circuit runs, the shank ends of these eyelets engaging against the metal shield and connect it to electrical ground of the circuit. Electrical insulation strips are positioned between the metal shield and the eyelets which connect the lamp lead-in wires to prevent shorting of the lamps by the metal shield.

The above-referenced Jehlicka patent application discloses a method of connecting the flash lamp lead-in wires to the rivets in the circuit board, comprising bending the extending rivet shanks sideways sufficiently to hold the lead-in wires and secure the eyelets to the circuit board.

SUMMARY OF THE INVENTION

Principal objects of the invention are to provide an improved way of electrically connecting a circuit board to a shield member, and of spacing the shield member from the circuit board, in a photoflash array.

The invention comprises, briefly and in a preferred embodiment, a photoflash array having a plurality of flash lamps each having a pair of lead-in wires, a circuit board carrying firing circuitry for said lamps and having pairs of connector areas for the respective pairs of lead-in wires, an opening through the board at each of the connector areas, and eyelets respectively positioned through said openings so as to respectively contact the connector areas. The shanks of the eyelets extend from a side of the board, and the pairs of lamp lead-in wires are respectively positioned in the eyelets at the pairs of connector areas. The extending shanks of the eyelets are bent sufficiently sideways to hold the lead-in wires and secure the eyelets to the board. One connector area of each said pair thereof is connected to electrical ground of the firing circuitry, and the shanks of one or more of the eyelets in contact with the electrical ground connector areas are bent so as to extend farther from said side of the board than the other eyelet shanks. A sheet-like metal shield member is positioned substantially parallel to and spaced from said side of the circuit board and in contact against one or more of said farther extending eyelet shanks so that the shield member is connected to the electrical ground of the firing circuitry. The farther extending eyelets function, in addition to or in lieu of connecting the shield member, to space the shield member from said other eyelet shank so as not to short-circuit the pairs of lamp lead-in wires. In a modification, plastic flash-indicator material is applied to the surface of the metal shield facing the circuit board, and one or more of the farther extending eyelet shanks abrade and penetrate through the flash-indicator material to make contact with the metal shield member. Not all of the pairs of eyelets need to be differentially bent so that one extends farther from the circuit board than the other, so long as a sufficient number of them are differentially bent to achieve electrical grounding of the shielf member and/or spacing of the shield member from the other eyelets.

DESCRIPTION OF THE PREFERRED EMBODIMENTS

Figure 1:
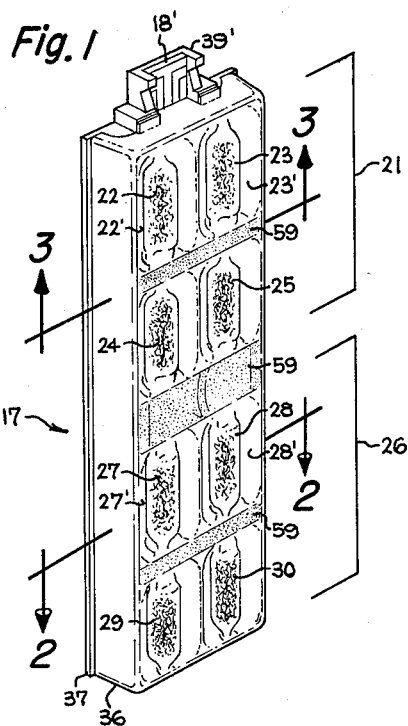
FIG. 1 is a perspective view of a multiple flash lamp array.

A multiple flash lamp unit 17 of the planar array type and containing a plurality of electrically fired flash lamps is provided with a plug-in connector tab 18 at the lower end thereof, adapted to fit into a socket of a camera or flash adapter as shown and described in U.S. Pat. No. 3,937,946 to Weber. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect.

Figure 2:
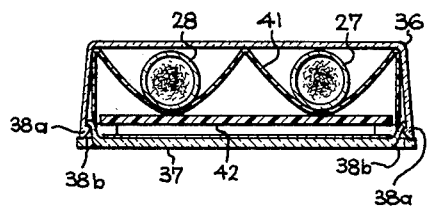
FIG. 2 is a sectional view taken on the line 2—2 of FIG. 1.

The general construction of the arrays, also disclosed in U.S. Pat. No. 3,935,442 to Hanson, comprises front and back housing members 36 and 37, which preferably are made of plastic and are provided with interlocking members 38 which can be molded integrally with the housing members and which lock the housing members together in final assembly to form a unitary flash array structure. FIG. 2 shows a pair of interlocking members 38a carried at the rear of the side of the front housing member 38 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminim-coated plastic) shaped to provide the individual reflectors 22', etc., a printed circuit board 42 provided with integral connector tabs 18 and 18', and an indicia sheet 43 which may be provided with instructions, information, the other indicia such as flash indicators as described in the above-referenced Hanson patent and Blount patent application. The indicia sheet 43 comprises a sheet of paper 44 carrying a metal shield 46 in the form of a layer or coating of metal such as aluminum on its front surface, and a flash indicator coating or sheet 48 of plastic over the shield 46. Openings 51 are provided through the reflector unit 41 and the circuit board 42 to facilitate radiation from flashing lamps reaching the flash indicator sheet 48 which shrinks or melts or changes color behind a flashed lamp in response to radiation from the lamp when flashed, thus indicating the lamp has been flashed. Openings 51' are provided through the paper sheet 44 and metal shield layer 46, in alignment with the openings 51 through the circuit board and reflector unit, and the rear housing member 37 is transparent (either of clear material or provided with window openings) to permit viewing of the flash indicators and other indicia on the indicia sheet 43 from the rear of the array. The flash indicator sheet 48 cam comprise two or more individual sheets covering the openings 51'. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., are attached to the circuit board 42 by means of metal eyelets 22a', 22b', etc., placed through openings in the board. The lead wires 22a, 22b, etc., pass through openings 52 in the reflector member 41 and into or through the respective pairs of eyelets 22a', 22b', etc., and the ends of the eyelets are crimped and bent sideways to hold the lead wires and make electrical contact thereto and also to hold the eyelets in place with their heads in electrical contact with the circuit of the circuit board. In accordance with the invention, one or more eyelets are bent so as to extend farther from the board than the other eyelets. A method of accomplishing this will be described with reference to FIGS. 5–8, and the resulting structure will be described with reference to FIG. 3.

A metal clip 56 is clipped onto the reflector member 41, which reflector preferably is made of metal-coated plastic, and the rear of the clip 56 rests in touching contact against as area 57 of an electrical ground circuit run 58 on the board and which includes the terminals 31 and 31' and which makes contact with one of the connector eyelets 22a' or 22b', etc., for each of the lamps 22, etc., whereby the reflector unit 41 additionally functions as an electrically grounded shield, as disclosed in the above-referenced Hanson patent.

Areas 59 on the transparent front housing member 36 may be made opaque or partly opaque, such as by making the surface roughened at these areas, to fully or partly conceal the lamp lead-in wires 22a, 22b, etc, and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63. The remaining lead-in wires of the lamps are connected to the electrical ground circuit run 58 which comprises the terminals 31 and 31'.

Figure 4:
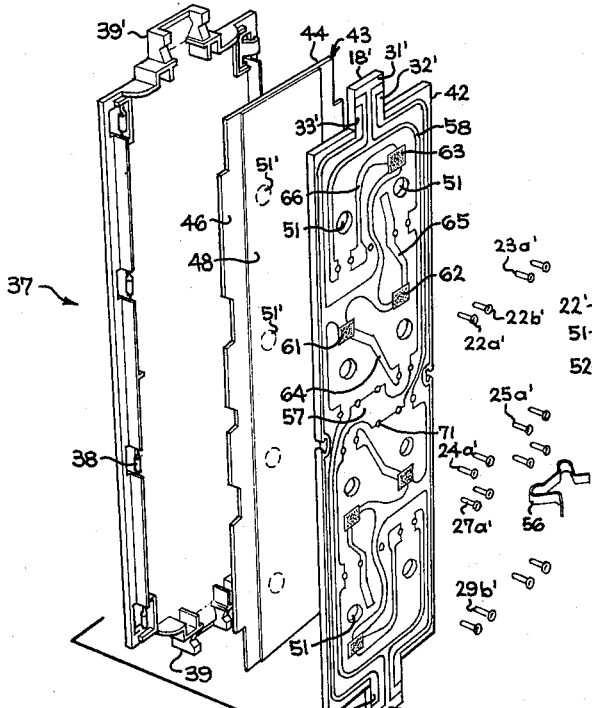
FIG. 4 is an exploded view of the array of FIG. 1.
Figure 4:
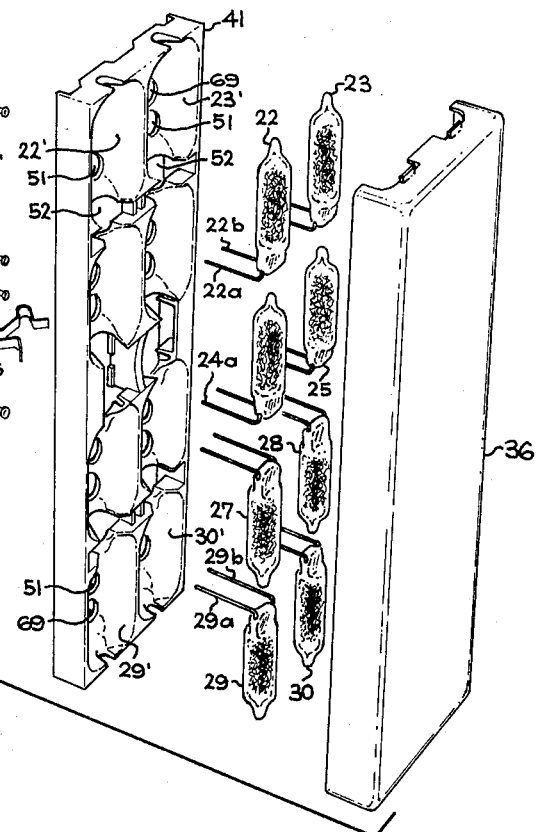
Figure 5:
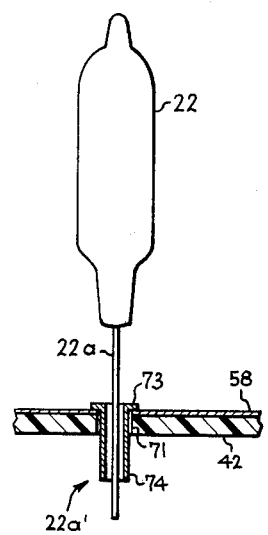
FIGS. 5, 6, 7, and 8 illustrate steps in the method of the invention for attaching flash lamp lead-in wires to a circuit board.
Figure 6:
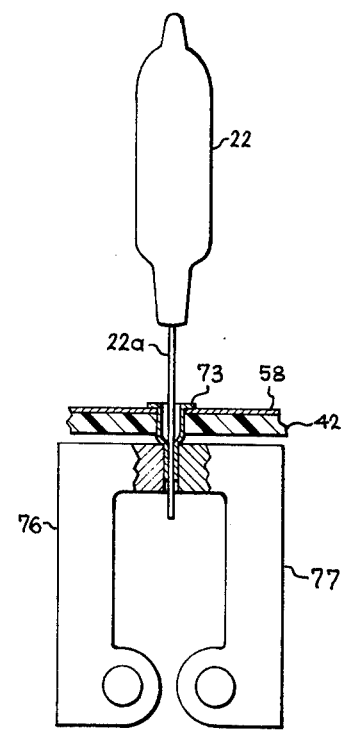
Figure 7:
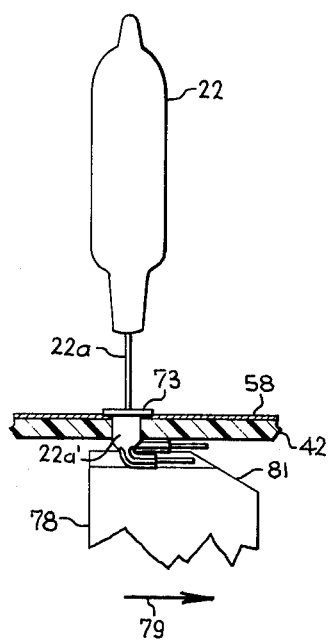

The radiation switches 61, 62 and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 4 to facilitate radiation transfer. A suitable material for the radiation switches is silver oxide dispersed in a binder such as polyvinyl resin. Each of these radiation switches, upon receiving head and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it cause the radiation switch 63 to become essentially a closed circuit across its terminals. Thus, the next firing pluse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltge types, requiring about 1000 volts for example, at low current, for flashing, and they can be fired by impacting or stressing a piezoelectric element in the camera, as disclosed in U.S. Pat. Nos. 2,972,937 and 3,106,080 to C. G. Suits.

Figure 3:
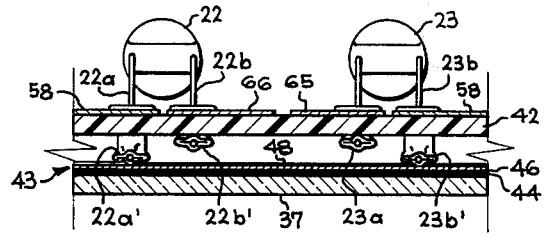
FIG. 3 is a partial sectional view taken on the line 3—3 of FIG. 1

In accordance with the invention, one or more of the eyelets 22a', etc., that are connected to the electrically grounded lead-in wires of the flash lamps are shaped to extend farther from the back side of the circuit board then the other or electrically "hot" eyelets. This can be done, as will be explained with reference to FIGS. 5-8, by differentially bending the pair of eyelet shanks for each lamp so as to hold the lead-in wires and so that the electrically grounded eyelet shank for each lamp, or for at least one of the lamps, extends farther from the circuit board surface then the other eyelet shanks. Thus, as shown in FIG. 3, the electrically grounded eyelets 22a' and 23b' which connect a lead-in wire of each of flash lamps 22 and 23 extend farther from the back surface of the circuit board 42 than do the other or "hot" eyelets 22b' and 23a' of these lamps, and these farther extending eyelets 22a' and 23b' contact against the indicia sheet 43 and hold it in position against the back 37 of the housing. Additional electrically grounded farther extending eyelets can be provided at some or all of the remaining lamp lead-in wire connections if desired. The farther extending eyelets 22b', 23b', etc., function to space the shield member 46 away from the circuit board so as to reduce stray capacitive coupling between the shield member and the circuitry carried on the circuit board, thus diminishing adverse effects of such stray coupling which are more fully described in the above-referenced Blount patent application.

The farther extending eyelets 22a', 23b', etc., also function to space the shield member 46 away from the other or "hot" eyelets 22b', 23a', etc., to prevent short-circuiting of the pairs of lead-in wires of the lamps by the shield member 46. The farther extending eyelets 22a', 23b', etc., being connected to electrical ground of the circuitry of the circuit board 37, can also function to electrically ground the shield 46 to the circuitry of the circuit board 37. This can be achieved by providing the flash indicator material 48 only at the openings 51' in the indicia sheet 43, or by providing openings through the flash indicator material 48 in alignment with the farther extending eyelets 22a', 23b', etc., or by other arrangements, so that these eyelets can make contact directly against the shield member 46. Alternatively, the farther extending eyelets 22a', 23b', etc., can be forced to abrade and penetrate through the flash indicator material 48 so as to contact against the shield member 46; this will be facilitated if the ends of the farther extending eyelets are rough or burred, and/or if the eyelet shanks are bent less than 90° and angled toward the indicia sheet 43 so that the edges of the ends of the eyelet shanks abrade and penetrate through the flash indicator material 48. A suitable flash indicator material is a thin sheet or coating of heat-sensitive plastic material, such as biaxially oriented polypropylene, which shrinks or melts when subjected to heat or radiant energy from an adjacent flashing lamp thus effectively changing the color at the associated opening 51' in the indicia sheet.

When a plurality of farther extending eyelets 22a', 23b', etc., are provided for making an electrical ground connection to the shield member 46, it is possible that, due to mechanical variations in configuration, not all of them will make contact with the shield member 46; however, it is sufficient for the purposes of the invention if one or more of the farther extending eyelets makes adequate electrical contact with the shield member, and those not making contact nonetheless perform the functions of spacing the shield member from the other or hot eyelets and from the circuit board. The functions of electrically grounding the shield member 46 and spacing it from the circuit board and hot eyelets can be augmented, if desired, by one or more eyelets extending through openings 71 in the circuit board 42 at the central electrical ground area 57, and extending sufficiently from the back of the circuit board to contact against the shield member 46 in the manner disclosed in the above-referenced Blount patent application. When such a modification is employed the eyelets for the four central lamps 24, 25, 27, and 28 do not have to be differentially shaped so that one of each pair extends relatively farther from the circuit board. The electrically grounded shield member 46 functions to protect the lamps from accidental flashingg by electrostatic charges applied to the back of the array and/or applied to the "T-bar" electrical ground terminal 31 or 31' when the array is handled, as is more fully described in the above-referenced Blount patent application and also in U.S. Pat. No. 3,941,992 to Blount, Cote, and Zukowski.

Figure 8:
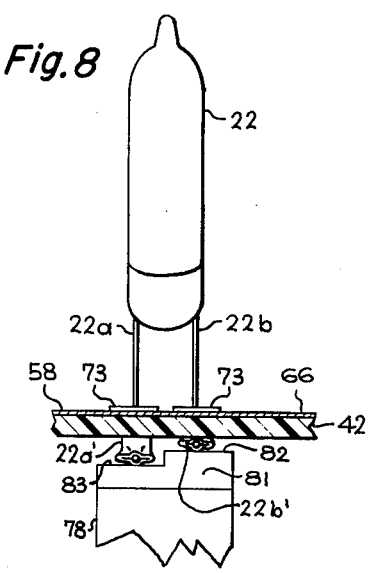

A preferred method of carrying out the invention, illustrated in FIGS. 5-8, and for connecting the flash lamp 22 for example, comprises the steps of providing the circuit board 42 of electrically insulating material and carrying the circuit runs 58 and 66 on a first side thereof, providing openings 71 through the board at or adjacent to the conductors 58 and 66, and inserting the eyelets 22a' and 22b' of metal or other conductive material through the openings 71 from said first side of the board so that the heads 73 of the eyelets contact against the conductors 58 and 66 and the shanks 74 of the eyelets extend from the other side of the board. The lead-in wires 22a and 22b of the flash lamp 22 are inserted into or through the eyelets 22' and 22b'. An optional step, shown in FIG. 6, consists of crimping and flattening the extending eyelet shanks against the lead-in wires 25a and 25b, such as by means of a pair of opposed jaws 76, 77. Then the eyelet shanks 74 are bent over sideways, such as by a sideways wiping action of a tool 78 (FIG. 7) moving in the direction of the arrow 79 while the board is held in position. The leading edge of the tool may be beveled as indicated at 81 to facilitate initial bending of the eyelets. As shown in FIG. 8, which is a 90° rotated view of FIG. 7, and in accordance with the invention, the wiping top surface of the tool 78 has a first-level surface 82 which bends the shank of the electrically hot eyelet 22b' relatively close to the circuit board, and a second-level surface 83 which is relatively farther from the circuit board than the first-level surface 82 and which bends the shank of the electrically grounded eyelet 22a' so that it extends farther from the circuit board than that of eyelet 22b'. The eyelets for all of the lead-in wires of all of the flash lamps can be "wiped" over the by a single pass of a pair of tools 78, or a plurality of tools 78 can be employed for wiping the lead-in wires and eyelets of individual lamps or of groups of lamps. If desired, the tool or tools 78 can be fixedly positioned and the board can be moved over them. The eyelet shanks need not be bent completely sideways, but should be bent at least 45°. The optional crimping step of FIG. 6 need not be employed if the eyelet shank walls are sufficiently thin with relationship to their lengths so that the shanks will become crimped while being bent in the step of FIG. 7. If the optional crimping and flattening of the eyelet shanks is utilized (per FIG. 6), the wiping action of FIG. 7 should be done in a direction against the flat sides of the eyelet shanks so that they can be bent over easily.

While preferred embodiments and modifications of the invention have been shown and described, various other embodiments and modifications thereof will become apparent to persons skilled in the art, and will fall within the scope of the invention as defined in the following claims.

What I claim as new and desire to secure by Letters Patent of the United States is:

1. A photoflash array comprising a plurality of flash lamps each having pair of lead-in wires, a circuit board carrying circuitry for flashing said lamps and having pairs of connector areas for the respective pairs of lead-in wires of said lamps, pairs of openings through said circuit board at said pairs of connector areas, respectively, a plurality of pairs of eyelets respectively positioned through said pairs of openings with the eyelet shanks extending from one side of said circuit board, said flash lamps being positioned over the other side of the circuit board and their pairs of lead-in wires respectively extending into and connected to said pairs of eyelets, and a sheet-like electrically conductive shield member positioned substantially parallel to said one side of the circuit board, one of the eyelet shanks of one or more of said pairs thereof extending farther from said one side of the circuit board than the other eyelet shank of the pair and contacting against said shield member to space it from said circuit board.

2. An array as claimed in claim 1, in which said farther extending eyelets are connected to electrical ground of said circuitry, and in which said shield member comprises a conductive surface facing said circuit board and in contact against one or more of said farther extending eyelets.

3. An array as claimed in claim 1, in which the shanks of at least one of said pairs of eyelets are bent substantially sideways in a manner such that one of them extends farther from the circuit board than does the other.

4. An array as claimed in claim 3, in which each of said eyelet shanks is bent at an angle of between about 45° to about 90°.

5. An array as claimed in claim 3, in which said farther extending eyelets are connected to electrical ground of said circuitry, and in which said shield member comprises a sheet of paper containing a metal coating on one side thereof and positioned with the metal coating facing said circuit board and in contact against one or more of said farther extending eyelets.

6. An array as claimed in claim 5, in which said shield member includes a layer of flash indicator material over said metal coating, and in which one or more of said farther extending eyelets penetrates through said flash indicator material to make said contact against the metal coating.

7. An array as claimed in claim 5, containing eight flash lamps arranged in two columns of four lamps each, said farther extending eyelets being provided only at a lead-in wire of each of the four lamps constituting the end lamps of both of said columns.

8. A method of making a photoflash array, comprising the steps of providing a circuit board carrying circuitry for firing flash lamps and having pairs of connector areas for lead-in wires of flash lamps, providing pairs of openings through said circit board at said pairs of connector areas, respectively, placing a plurality of eyelets respectively through said pairs of openings so that the eyelet shanks extend from one side of the circuit board, providing a plurality of flash lamps each having a pair of lead-in wires, positioning said flash lamps over the other side of the circuit board and placing their pairs of lead-in wires respectively into said pairs of eyelets, bending said eyelet shanks substantially sideways in a manner such that one of them of at least one pair thereof extends farther from said circuit board then does the other eyelet shank of the pair, and placing a sheet-like conductive shield member substantially parallel to said one side of the circuit board and in contact against at least one of said farther extending eyelet shanks.

9. A method as claimed in claim 8, in which said shield member is provided with a layer of flash indicator material on the side thereof facing the circuit board, and including the step of causing at least one of said farther extending eyelet shanks to abrade and penetrate through said flash indicator so as to contact against said shield member.

10. A method as claimed in claim 8, in which the eyelet shanks of at least one pair thereof are bent by wiping over them with a tool having a first surface which bends one eyelet shank of said pair thereof and which is spaced from said one side of the circuit board during said wiping, said tool having a second surface which bends the other eyelet shank of said pair thereof and which is spaced farther from said one side of the circuit board than is said first surface during said wiping.

* * * * *

UNITED STATES PATENT OFFICE
CERTIFICATE OF CORRECTION

PATENT NO. : 4,036,578
DATED : July 19, 1977
INVENTOR(S) : Richard M. Herman

It is certified that error appears in the above-identified patent and that said Letters Patent are hereby corrected as shown below:

In column 8, line 57, change "then" to --than--.
line 58, change "the" to --that--.

Signed and Sealed this

Tenth Day of October 1978

[SEAL]

Attest:

RUTH C. MASON
Attesting Officer

DONALD W. BANNER
Commissioner of Patents and Trademarks

Notice of Adverse Decision in Interference

In Interference No. 99,854, involving Patent No. 4,036,578, R. M. Herman, PHOTOFLASH ARRAY AND METHOD OF CONSTRUCTION, final judgment adverse to the patentee was rendered May 30, 1979, as to claims 2, 5, 6, 7 and 9.

[*Official Gazette September 4, 1979.*]